United States Patent
Inbar et al.

(10) Patent No.: US 11,205,473 B2
(45) Date of Patent: Dec. 21, 2021

(54) DUAL SLC/QLC PROGRAMMING AND RESOURCE RELEASING

(71) Applicant: Western Digital Technologies, Inc., San Jose, CA (US)

(72) Inventors: Karin Inbar, Ramat Hasharon (IL); Shay Benisty, Beer Sheva (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/781,885

(22) Filed: Feb. 4, 2020

(65) Prior Publication Data
US 2021/0241819 A1    Aug. 5, 2021

(51) Int. Cl.
| | | |
|---|---|---|
| G11C 11/40 | (2006.01) | |
| G11C 11/4093 | (2006.01) | |
| G11C 11/56 | (2006.01) | |
| G06F 13/16 | (2006.01) | |
| G06F 11/07 | (2006.01) | |

(52) U.S. Cl.
CPC ........ *G11C 11/4093* (2013.01); *G06F 11/076* (2013.01); *G06F 13/1673* (2013.01); *G11C 11/5628* (2013.01); *G11C 11/5642* (2013.01); *G11C 2211/5641* (2013.01)

(58) Field of Classification Search
CPC ............ G11C 11/4093; G11C 11/5628; G11C 11/5642; G11C 2211/5641; G06F 11/076; G06F 13/1673
See application file for complete search history.

(56) References Cited

U.S. PATENT DOCUMENTS

| | | | | |
|---|---|---|---|---|
| 5,504,859 A | * | 4/1996 | Gustafson | ............... G06F 11/10 714/11 |
| 7,000,073 B2 | * | 2/2006 | Chen | ......................... G06F 5/10 710/52 |
| 7,719,889 B2 | * | 5/2010 | Lin | ..................... G11C 11/5628 365/185.03 |
| 8,468,294 B2 | | 6/2013 | Huang et al. | |

(Continued)

FOREIGN PATENT DOCUMENTS

KR      20150018732 A      2/2015

OTHER PUBLICATIONS

Korean Office Action for Korean Application No. 10-2020-0070935 dated Oct. 28, 2021, 4 pages.

*Primary Examiner* — Vanthu T Nguyen
(74) *Attorney, Agent, or Firm* — Patterson & Sheridan, LLP; Steven H. Versteeg

(57) ABSTRACT

The present disclosure generally relates to improved foggy-fine programming. Rather than initially writing to SLC and then later performing a foggy write to QLC with the data read from SLC and then a fine write to QLC with data re-read from SLC, the foggy write to QLC can be performed in parallel to the initial writing to SLC using the same buffer. Once the foggy write to QLC has completed, and the writing to SLC has also completed, the data buffer can be released. The data written in SLC is then be read from SLC and passes through a relocation buffer for the first and only time to then be written using fine programming to QLC. Thus, the data only passes through the relocation buffer one time and the relocation buffer can be freed to usage after only one pass of the data therethrough.

20 Claims, 7 Drawing Sheets

(56) References Cited

U.S. PATENT DOCUMENTS

| | | | |
|---|---|---|---|
| 8,825,941 | B2 | 9/2014 | Moshayedi et al. |
| 8,886,877 | B1 | 11/2014 | Avila et al. |
| 9,092,340 | B2 | 7/2015 | Sprouse et al. |
| 9,400,713 | B2 | 7/2016 | Gorobets |
| 9,495,245 | B2 * | 11/2016 | Peddle ................ G06F 12/0246 |
| 9,530,491 | B1 * | 12/2016 | Uttarwar ............. G06F 12/0246 |
| 10,223,001 | B2 * | 3/2019 | Saito ....................... G06F 12/02 |
| 10,613,796 | B2 * | 4/2020 | Kanno .................. G06F 3/0688 |
| 2008/0316815 | A1 | 12/2008 | Lin |
| 2015/0003152 | A1 | 1/2015 | Kwak et al. |
| 2019/0278701 | A1 | 9/2019 | Enz et al. |
| 2020/0073795 | A1 * | 3/2020 | Asano .................. G06F 3/0679 |

* cited by examiner

DUAL SLC/QLC PROGRAMMING AND RESOURCE RELEASING

BACKGROUND OF THE DISCLOSURE

Field of the Disclosure

Embodiments of the present disclosure generally relate to improving foggy-fine writing to MLCs, such as QLC, and appropriately releasing buffer resources following use.

Description of the Related Art

Programming or writing data may require two writing phases: foggy and fine. In foggy-fine programming, the bits to be written cannot simply be written once. Rather, the data needs to be first written by foggy programming where voltage pulses are provided to push the current state to a more resolved state, but not completely resolved state. Fine programming is performed at a point in time after foggy programming to write the data again in the completely resolved state.

To perform foggy-fine programming, multiple megabytes may be programmed multiple times. To perform the multiple programming, a large amount of data needs to be set aside in order to perform repeat programming with the exact same data. Storing the data takes up buffer space. The buffer space can't be released until the data has been written at least twice, once foggy and once fine. Because the buffer space is in use, additional data cannot be placed in the buffer space, which leads to slower processing and insufficient buffer storage.

A solution is to simply increase buffer storage capacity. However, adding additional buffer storage capacity requires additional funds for larger capacity buffer storage devices. Additional buffer storage devices, or larger buffer storage devices, requires more real estate within ever shrinking devices.

Therefore, there is a need in the art for improved foggy-fine programming.

SUMMARY OF THE DISCLOSURE

The present disclosure generally relates to improved foggy-fine programming. Rather than initially writing to SLC and then later performing a foggy write to an MLC with the data read from SLC and then a fine write to the MLC with data re-read from SLC, the foggy write to the MLC can be performed in parallel to the initial writing to SLC using the same buffer. Once the foggy write to the MLC has completed, and the writing to SLC has also completed, the data buffer can be released. The data written in SLC is then be read from SLC and passes through a relocation buffer for the first and only time to then be written using fine programming to the MLC. Thus, the data only passes through the relocation buffer one time and the relocation buffer can be freed to usage after only one pass of the data therethrough.

In one embodiment, a data storage device comprises: one or more memory devices, the one or more memory devices including SLC memory and MLC memory; and a controller coupled to the one or more memory devices, the controller configured to: write data to the SLC memory; foggy write the data to MLC memory, wherein the foggy writing the data to the MLC memory occurs in parallel to the writing data to the SLC memory using the same buffer; read the data from the SLC memory; and fine writing the data read from SLC memory to the MLC memory.

In another embodiment, a data storage device comprises: one or more memory devices; and a controller coupled to the one or more memory devices, the controller configured to: determine whether a first buffer release request for a buffer has been received; determine whether a second buffer release request for the buffer has been received; and release the buffer to an available buffer pool of buffers.

In another embodiment, a data storage device comprises: one or more memory devices; means to determine that a buffer has received two release requests; and means to foggy write to MLC memory in parallel with writing to SLC memory.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to improved foggy-fine programming. Rather than initially writing to SLC and then later performing a foggy write to MLC with the data read from SLC and then a fine write to MLC with data re-read from SLC, the foggy write to MLC can be performed in parallel to the initial writing to SLC using the same buffer. Once the foggy write to MLC has completed, and the writing to SLC has also completed, the data buffer can be released. The data written in SLC is then be read from SLC and passes through a relocation buffer for the first and only time to then be written using fine programming to MLC. Thus, the data only passes through the relocation buffer one time and the relocation buffer can be freed to usage after only one pass of the data therethrough. It is to be understood that while QLC has been described, the embodiments herein are applicable to multilevel cells (MLCs) including TLCs and QLCs.

Figure 1:
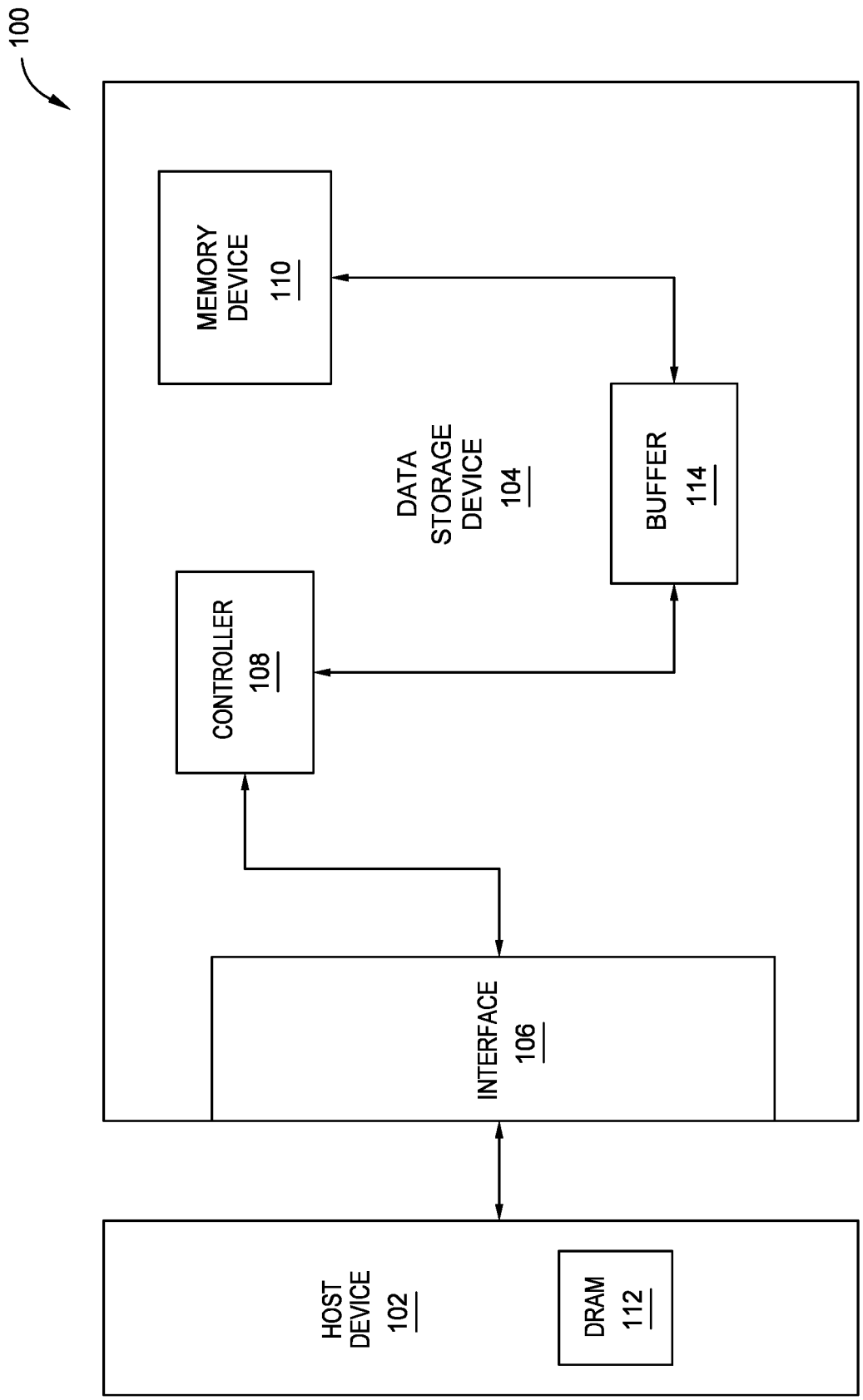
FIG. 1 is a schematic illustration of a system for storing data according to one embodiment.

FIG. 1 is a schematic illustration of a system for storing data according to one embodiment. The system 100 for storing data according to one embodiment includes a host device 102 and a data storage device 104. The host device 102 includes a dynamic random-access memory (DRAM) 112. The host device 102 may include a wide range of devices, such as computer servers, network attached storage (NAS) units, desktop computers, notebook (i.e., laptop) computers, tablet computers (i.e., "smart" pad), set-top boxes, telephone handsets (i.e., "smart" phones), televisions, cameras, display devices, digital media players, video gaming consoles, video streaming devices, and automotive applications (i.e., mapping, autonomous driving). In certain embodiments, host device 102 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

The data storage device 104 communicates with the host device 102 through an interface 106 included in the data storage device 104. The data storage device 104 includes a controller 108, a buffer 114, and one or more memory devices 110. The data storage device 104 may be an internal storage drive, such as a notebook hard drive or a desktop hard drive. Data storage device 104 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Data storage device 104 may take the form of an embedded mass storage device, such as an eSD/eMMC embedded flash drive, embedded in host device 102. Data storage device 104 may also be any other type of internal storage device, removable storage device, embedded storage device, external storage device, or network storage device.

Memory device 110 may be, but is not limited to, internal or external storage units. The memory device 110 relies on a semiconductor memory chip, in which data can be stored as random-access memory (RAM), read-only memory (ROM), or other forms for RAM and ROM. RAM is utilized for temporary storage of data whereas ROM is utilized for storing data permanently.

Data storage device 104 includes a controller 108 which manages operations of data storage device 104, such as writes to or reads from memory device 110. The controller 108 executes computer-readable program code (e.g., software or firmware) executable instructions (herein referred to as "instructions") for the transfer of data. The instructions may be executed by various components of controller 108 such as processor, logic gates, switches, applications specific integrated circuits (ASICs), programmable logic controllers embedded microcontrollers, and other components of controller 108.

Data storage device 104 includes a buffer 114 which is a region of physical memory storage used to temporarily store data while it is being moved from one place to another (i.e., from host device 102 to data storage device 104).

Data may be transferred to or from the DRAM 112 of the host device 102 to the data storage device 104. One data transfer pathway may originate from the DRAM 112 of the host device 102 and communicate through the interface 106 of the data storage device 104 to the controller 108. The data will then pass through the buffer 114 of the data storage device 104 and be stored in the memory device 110. If the data is written to a SLC memory, then the data is simply written. If, however, the data is written to a MLC, such as a QLC memory, then a foggy-fine writing process occurs. It is to be noted that writing and programming may be used interchangeably throughout the disclosure.

Figure 2A:
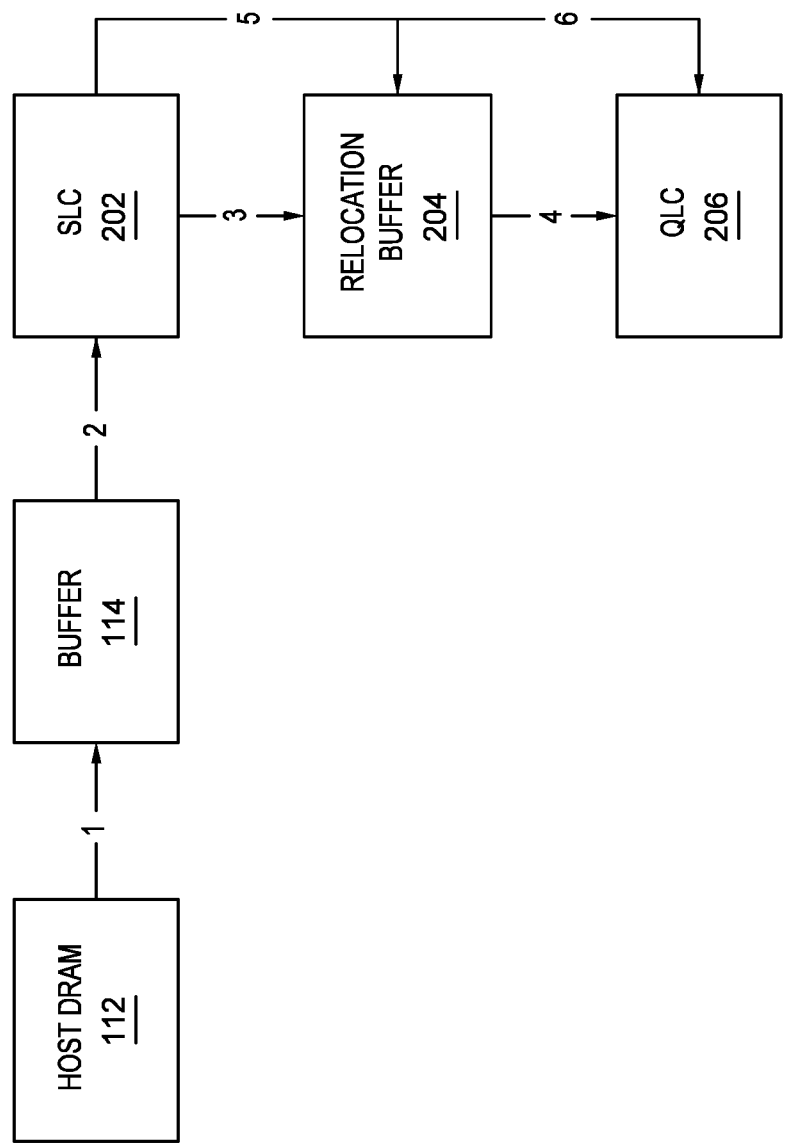
FIG. 2A is a schematic illustration of foggy-fine writing process according to one embodiment.

FIG. 2A is a schematic illustration of prior art foggy-fine writing process. Data originates from the host DRAM 112 and passes through the buffer 114 of the data storage device 104. The data is written onto the single-level cell (SLC) 202 and is then transferred through the relocation buffer 204 to be written onto the quad-level cell (QLC) 206. The initial write onto the QLC 206 is the "Foggy" write. The data will again be read and transferred from SLC 202 to relocation buffer 204 to QLC 206 as a "Fine" write. The same data is passed through the NAND-bus 5 times (i.e., through the buffer 114 one time, and through the buffer 204 four times). The total NAND load from buffer 114 to QLC 206 consists of 5 transfers: 1 write to SLC 202, 1 read from SLC 202, 1 write to QLC 206 (Foggy), 1 read from SLC 202, and 1 write to QLC 206 (Foggy). The total DRAM load for the Foggy and Fine write is 4 transfers: relocation from SLC 202 to QLC 206 (Foggy) and relocation from SLC 202 to QLC 206 (Fine). In case that the relocation buffer 204 resides in double data rate (DDR), the data passes through the DDR at least 4 times for 2 reads and 2 writes. The buffer 114 may reside in DRAM, and the data passes through DRAM 5 times. A performance bottleneck may occur due to the NAND-bus throughput and the DRAM-bus throughput.

Figure 2B:
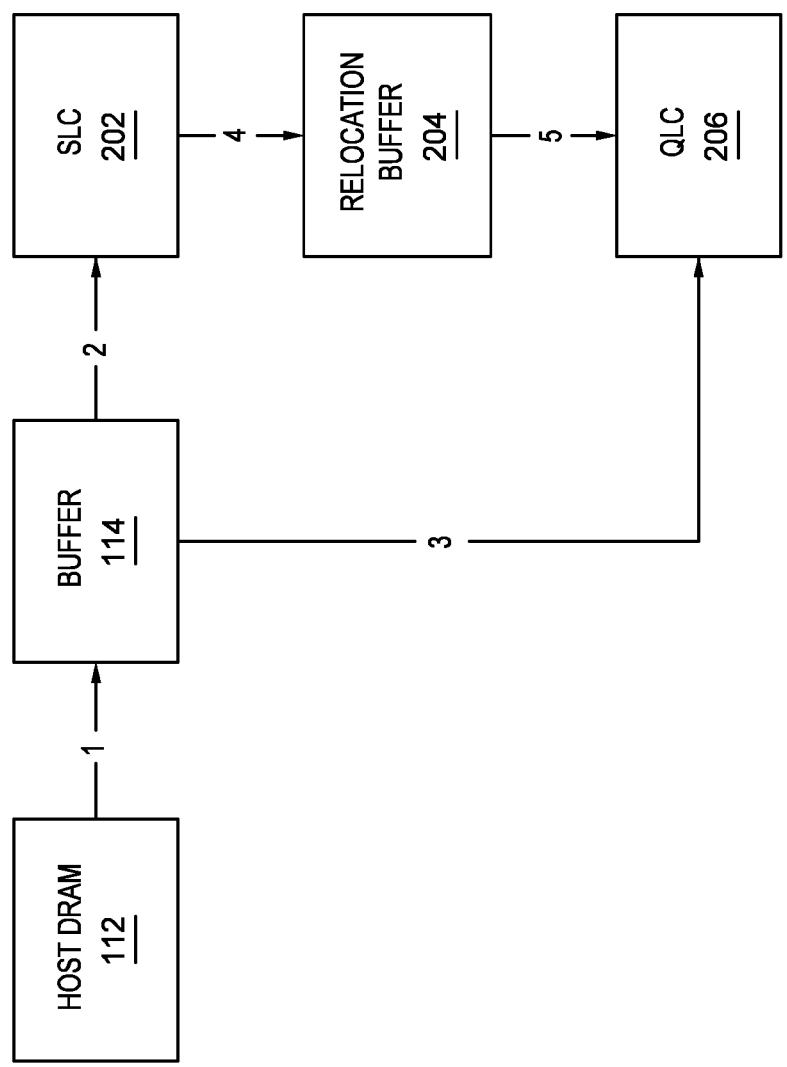
FIG. 2B is a schematic illustration of a foggy-fine writing process according to another embodiment.

FIG. 2B is a schematic illustration of a foggy-fine writing process according to one embodiment. To resolve the performance bottleneck due to the NAND-bus throughput and the DRAM-bus throughput of the prior art foggy-fine writing process of FIG. 2A, the schematic illustration of FIG. 2B executes the QLC foggy write in parallel to SLC programming step. The process utilizes the same resources and buffers which reduces the amount of NAND load transfers (from 5 to 4) and DRAM load transfers (from 4 to 2).

The host DRAM 112 passes data through the buffer 114. The data is read from the buffer 114 and is written in parallel to SLC 202 and QLC 206. The initial write to QLC 206 from buffer 114 is the Foggy step. Data is read from the SLC 202 and is passed through the relocation buffer 204 to the QLC 206. The write to QLC 206 from SLC 202 is the Fine step.

In one embodiment, the buffer 114 and relocation buffer 204 are separate items. In another embodiment, the buffer 114 and the relocation buffer 204 are the same buffer. In either case, the data needs to exit the buffer 14 two times.

Hence, the buffer 114 cannot be released to further use until the data has been released to both SLC 202 and QLC 206.

Figure 3:
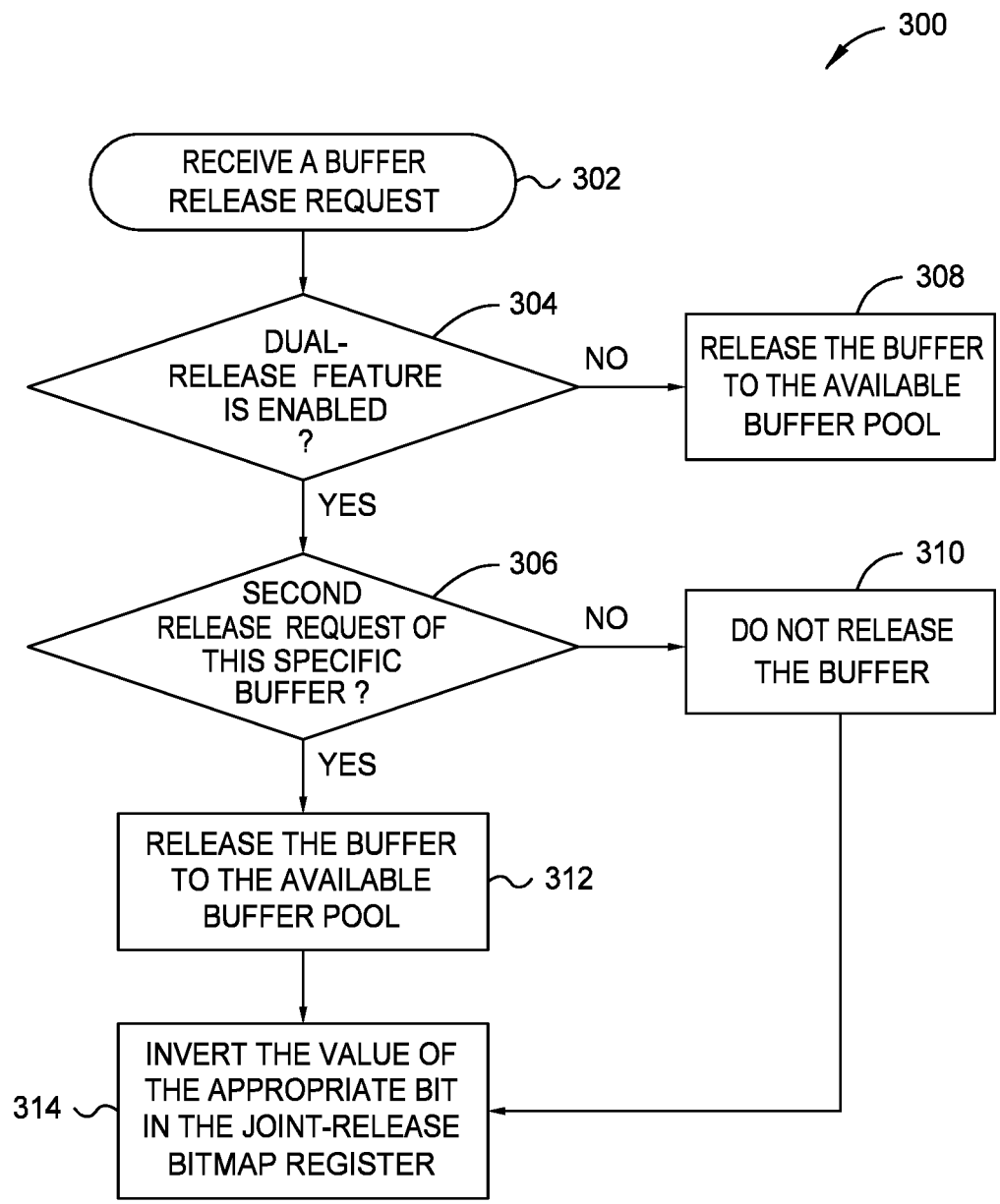
FIG. 3 is flowchart illustrating a method of determining whether a buffer can be released for further use according to one embodiment.

FIG. 3 is flowchart illustrating a method of determining whether a buffer can be released for further use according to one embodiment. One or more blocks of method 300 may be performed by controller 108 executing computer-readable program code (e.g., software or firmware) executable instructions store in data storage device 104. A dedicated hardware (HW) support will be added to the ASIC controller 108 for the dual-release of resources as a result of dual-programing of the same data to the SLC 202 and the QLC 206. A programming firmware (FW) flow will be changed to perform writing the in parallel to SLC 202 and QLC-FG 206. The ASIC controller 108 will receive a buffer release request 302 when writing data in parallel to the SLC 202 and the QLC 206. The buffer 114 will be released if certain criteria are met, freeing memory storage space. At block 304, the ASIC controller 108 determines if the dual-release (e.g. joint release) feature is enabled at the buffer 114. If the feature is not enabled, the buffer 114 will be released to the available buffer pool at block 308. If the feature is enabled, the ASIC controller 108 will determine if there is a second release request of the same buffer at block 306. The buffer 114 will not be released at block 310 if there is not a second release request of the buffer 114. The buffer 114 will be released to the available buffer pool at block 312 if there is a second release request of the buffer 114. The SLC 202 and QLC 206 zones may be implemented in different channels/dies and may issue a release request independent of the other. The dual-release of resources allows any order of buffer 114 release requests. At block 306, a dual-release bitmap register records a value of '1' or '0' that holds the release status of the relevant buffer. A value of '1' indicates that the first release request at block 302 was issued to the buffer 114 and a value of '0' indicates that no release request was issued at block 302. At block 314, the value of the appropriate bit in the dual-release bitmap register is inverted to indicate the release request of the buffer 114. The buffer 114 will be released if both SLC 202 and QLC 206 issues a release request.

Figure 4:
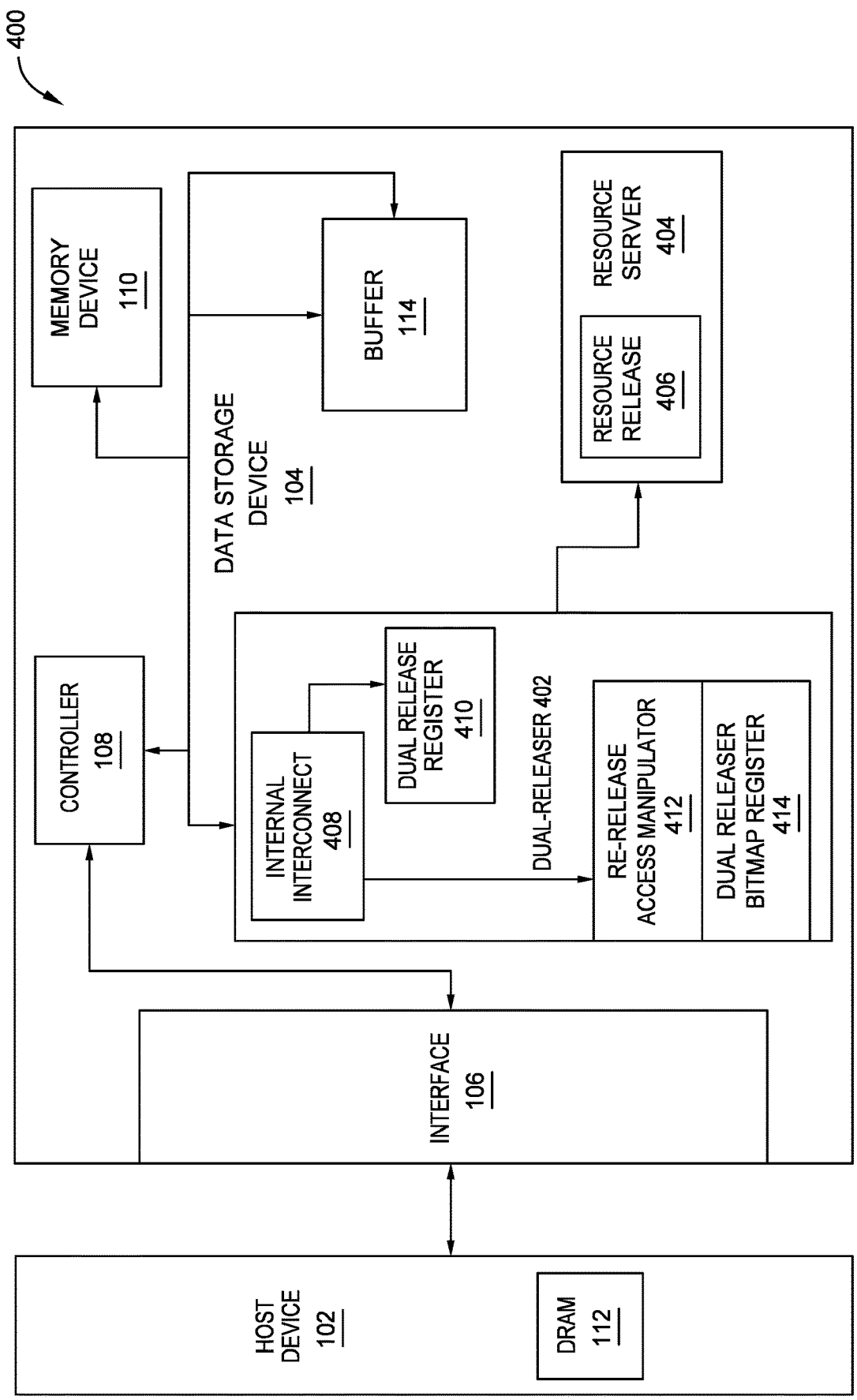
FIG. 4 is a schematic illustration of a system for storing data according to another embodiment.

FIG. 4 is a schematic illustration of a system for storing data according to another embodiment. The system 400 for storing data according to one embodiment includes a host device 102, a data storage device 104, a dual-releaser 402 (e.g., joint releaser), and a resource server 404. The dual-releaser 402 includes an internal interconnect 408, dual release register 410 (e.g., joint release register), re-release access manipulator 412, and a dual releaser bitmap register 414 (e.g., joint releaser bitmap register). The internal interconnect 408 allows access to the dual-releaser register 410, the re-release access manipulator 412 and the dual releaser bitmap register 414. The dual-releaser 402 communicates with the resource server (RS) 404 to release the resource (i.e., buffer 114) at block 406 if the criteria of the dual-release method 300 is met.

The dual releaser bitmap register 414 allocates one bit for each random-allocated buffer. The dual releaser bitmap register 414 assigns the value of the bit by determining the holding release state of each buffer. The definition of a new bit in the resource release 406 register will enable two-terminal tunneling random access memory (TRAM) random-allocation joint release. If the first access to the resource release 406 is corrupted, the buffer will not be released from the dual-releaser 404. The second access to resource release 406 will release the buffer from the dual releaser 404. The reduction of times the same data passes over the NAND-bus from 5 to 4 may improve write-performance potentially by 0-10%, 10-20%, 20-30%, 30-40%, 40-50%, or in the range of 0-50%, in which 25% is average. The reduction of times the relocated data passes through DRAM by 2 (from 4 or 5 to 2 or 3) may improve DRAM throughput potentially by 0-10%, 10-20%, 20-30%, 30-40%, 40-50%, 50-60%, 60-70%, or in the range of 0-70%, in which 50-66% is mathematically derived.

Figure 5:
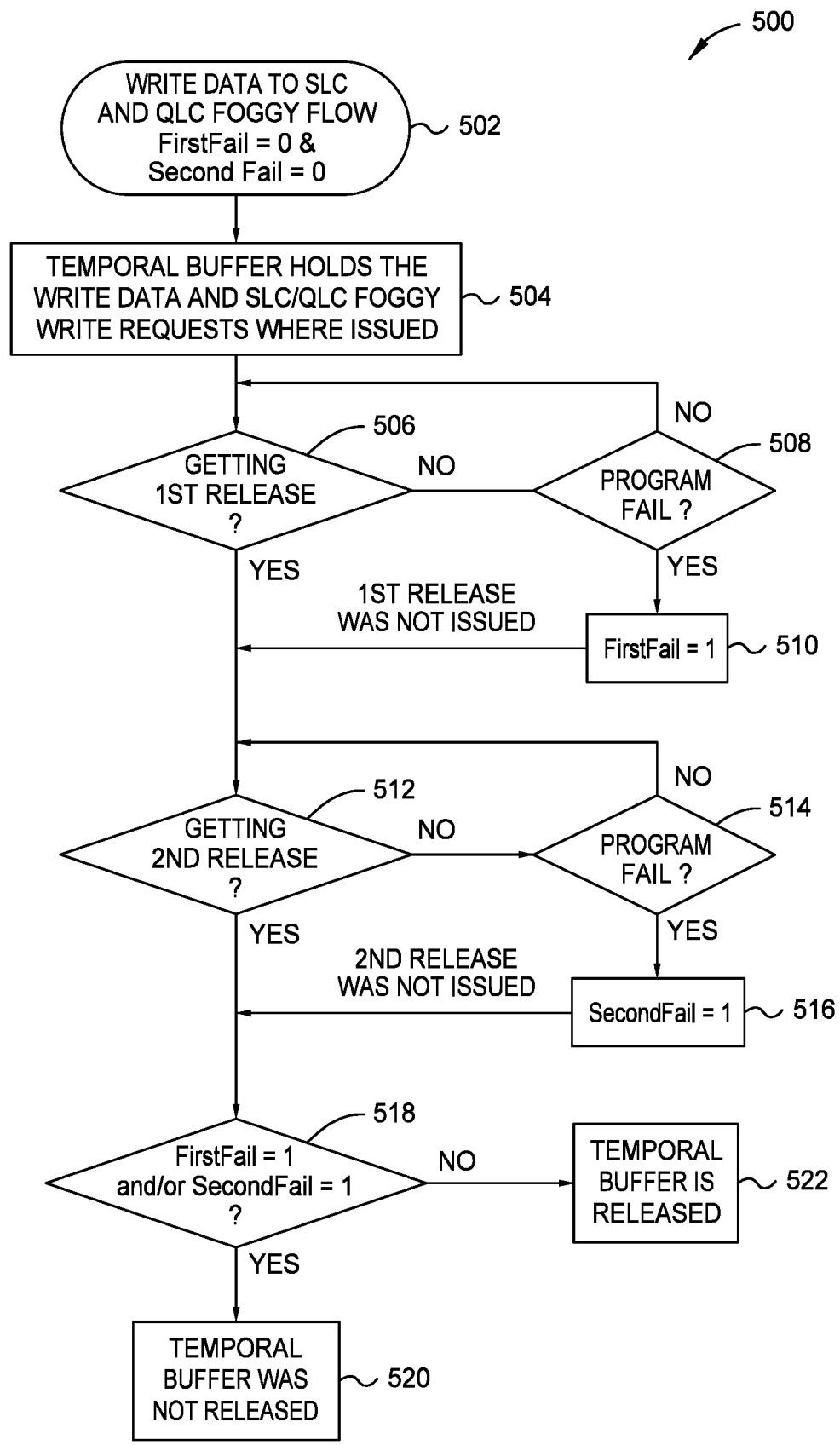
FIG. 5 is a flowchart illustrating a method of determining whether a buffer can be released for further use according to another embodiment.

FIG. 5 is a flowchart illustrating a method of determining whether a buffer can be released for further use according to another embodiment. One or more blocks of method 500 may be performed by controller 108 executing computer-readable program code (e.g., software or firmware) executable instructions stored in data storage device 104. The instructions proceed as a logic method to assign certain variables with a 0 or 1 determined by the argument. At block 502, data is written to SLC 202 and QLC 206 via Foggy flow and sets "FirstFail" and "SecondFail" equal to 0. At block 504, the temporal buffer 114 holds the write data and the issued SLC 202 write request and QLC 206 Foggy write request. If the first release request is received at block 506, the method proceeds to the second release request at block 512. If the program fails to receive a first release request at block 504, the program fail at block 508 will reassign "FirstFail" from 0 to 1 at block 510. The "FirstFail" equal to 1 signifies that the first release was not issued. If the program fails to receive a second release request at block 512, the program fail at block 514 will reassign "SecondFail" from 0 to 1 at block 516. The "SecondFail" equal to 1 signifies that the second release was not issued. If "FirstFail" or "SecondFail", or both equals 1, then the temporal buffer 114 will not be released at block 520. If "FirstFail" and "SecondFail" equals 0, then the temporal buffer 114 will be released at block 522.

During data failure at block 508 or at block 514, data buffers may or may not be available in static random access memory (SRAM) at buffer 114 or in DRAM at the host device 112. Data recovery may rely on the availability of data buffers for recovering data, or use other scheme (i.e., recovering with parities). If a program error during the write of data to QLC 206 during the Foggy step, data is either being programmed to SLC 206, or is still available in SRAM at buffer 114 or in DRAM at the host device 112 for recovery.

Figure 6:
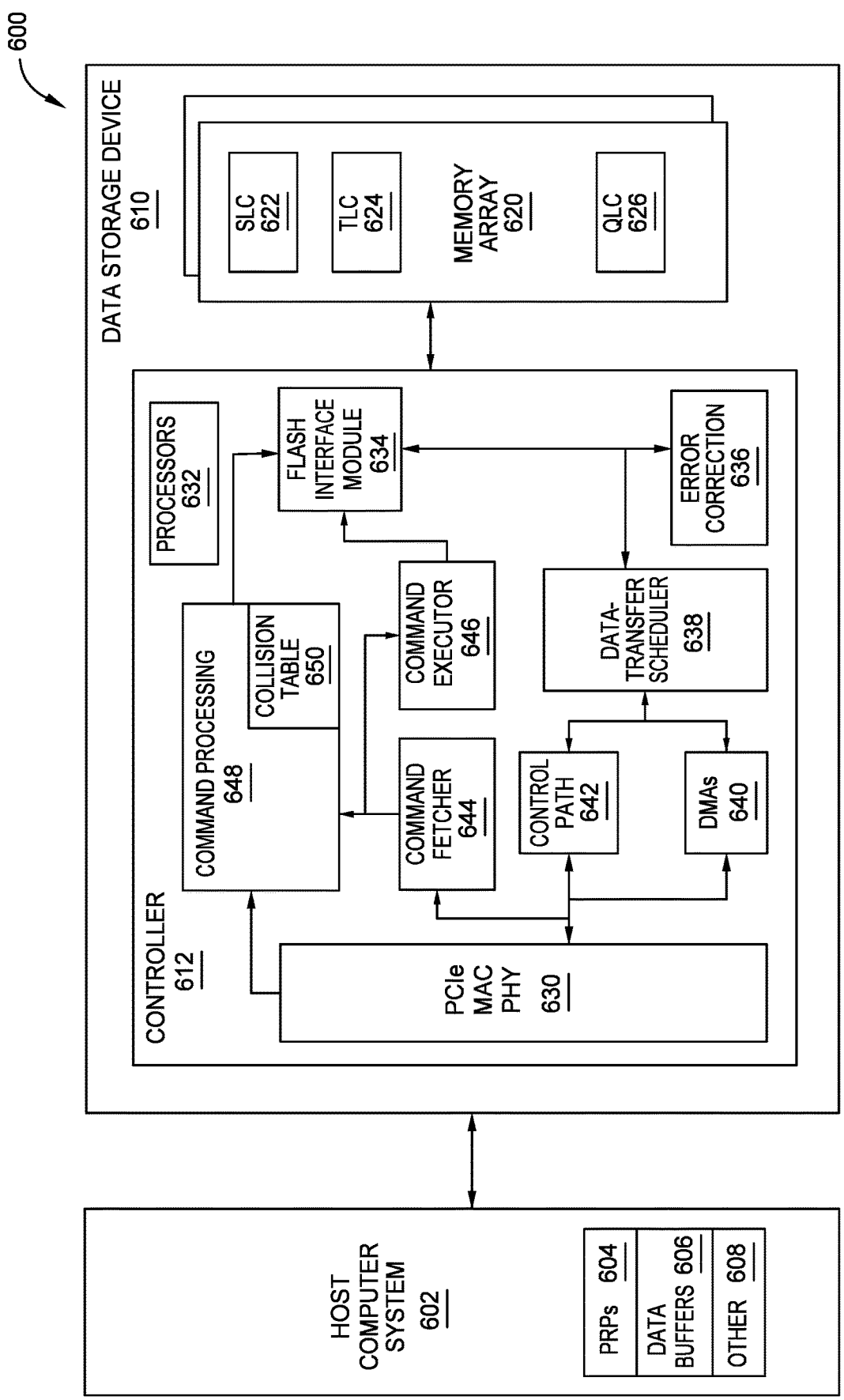
FIG. 6 is a schematic illustration of a system for storing data according to another embodiment.

FIG. 6 is a schematic illustration of a system for storing data according to another embodiment. The system 600 for storing data according to one embodiment includes a host computer system 602 and a data storage device 610. Host computer system 602 utilizes parallel redundancy protocols (PRPs) 604, data buffers 606, and other 608 components of the host computer system 602 that may be included, but not shown for clarity. The host computer system 602 may include a wide range of devices, such as computer servers, network attached storage (NAS) units, desktop computers, notebook (i.e., laptop) computers, tablet computers (i.e., "smart" pad), set-top boxes, telephone handsets (i.e., "smart" phones), televisions, cameras, display devices, digital media players, video gaming consoles, video streaming devices, and automotive applications (i.e., mapping, autonomous driving). In certain embodiments, host computer system 602 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

Other 608 components of the host computer system 602 may include, but are not limited to, a central processing unit (CPU) connected to a host memory space such as a DRAM or other main memories. An application program may be stored to another 608 component of the host computer system 602, such as a memory space, for execution by components of host computer system 602. Host memory space may include host queues, such as command submission queues and command completion queues. Host memory space may include data buffers 606, such as a host data buffer.

The controller 612 may include interface 630 for ingress of communications from host computer system 602 to data storage device 610 and egress of communications from data storage device 610 to host computer system 602 through interface 630. The interface 630 comprises of Peripheral Component Interface Express (PCIe), medium access control (MAC), and physical layer (PHY) components. A PCIe link may be one to thirty-two lanes, depending on the number of available PHYs connecting two PCIe. The PCIe link is typically set during end point device initialization, such as initialization of data storage device 610.

Host computer system 602 and interface 630 of the controller 612 operate under a communication protocol, such as a PCIe serial communication protocol or other suitable communication protocols. Other suitable communication protocols include Ethernet, serial attached SCSI (SAS), serial AT attachment (SATA), any protocol related to remote direct memory access (RDMA) such as Infiniband, iWARP, or RDMA over Converged Ethernet (RoCE), and other suitable serial communication protocols. Data storage device 610 may also be connected to host computer system 602 through a switch or a bridge.

Data storage device 610 according to one embodiment may include a controller 612 and a memory array 620. The data storage device 610 may utilize a memory array 620 to write and read data onto SLC 622, triple layer cells (TLC) 624, and QLC 626. Memory array 620 of data storage device 610 may be configured for long-term storage of information as non-volatile memory (NVM) space and retains information after power on/off cycles. NVM 620 may consist of one or more dies of NAND flash memory. Other examples of NVM included phase change memories, ReRAM memories, MRAM memories, magnetic media (including shingle magnetic recording), optical disks, floppy disks, electronically programmable read only memories (EPROM), electronically erasable programmable read only memories (EEPROM), and other solid-state memories. Magnetic media NVM may be one or more magnetic platters in data storage device 610. Each platter may contain one or more regions of one or more tracks of data. NVM 620 may include one or more types of non-volatile memory.

Data storage device 610 includes a controller 612 which manages operations of storage device 610, such as writes to and reads from NVM 620. Controller 612 includes one or more processors 632, which may be multi-core processors. Processor 632 handles the components of data storage device 610 through firmware code.

Controller 612 may operate under NVM Express (NVMe) protocol, but other protocols are applicable. NVMe protocol is a communications interface/protocol developed for SSDs to operate over a host and storage device linked over a PCIe interface. NVMe protocol provides a command submission queue and command completion queue for access of data stored in data storage device 610 by host computer system 602. Data storage device 610 may fetch or read host commands from a command submission queue of host queues 608 of host memory space 608.

The controller 612 executes computer-readable program code (e.g., software or firmware) executable instructions (herein referred to as "instructions") for the transfer of data. The instructions may be executed by various components of controller 612 such as processor 632, logic gates, switches, applications specific integrated circuits (ASICs), programmable logic controllers embedded microcontrollers, and other components of controller 612.

The instructions are stored in a non-transitory computer readable storage medium. In certain embodiment, the instructions are stored in a non-transitory computer readable storage medium of data storage device 610, such as a read-only memory or NVM 620. Instructions stored in data storage device 610 may be executed without added input or directions from host computer system 602. In other embodiments, the instructions are transmitted from host computer system 602. The controller 612 is configured with hardware and instructions to perform various functions described herein and shown in the figures.

Controller 612 also includes other components, such as flash interface module 634, a direct memory access (DMA) module 640, an error correction module 636, a command executer 646, a command fetcher 644, a command processor module 648, a control path 642, and a data-transfer scheduler 638. Flash interface module 634 interacts with NVM 620 for read and write operations. DMA module 640 executes data transfers between host computer system 602 and data storage device 610 without involvement from the CPU. Data-transfer scheduler 638 controls the data transfer while activating the control path 642 for fetching physical page regions (PRPs), posting completion and interrupts, and activating DMAs for the actual data transfer between host computer system 602 and data storage device 610. Error correction module 636 corrects the data fetched from the memory arrays. Command fetcher 644 fetches commands to command executor 140 for execution on flash interface module 634.

Dedicated logic exists in the command processing module 648 to ensure that there is no collision between the read command and the cache write data. If collision is detected, the read command is held in the collision queue until the collision is resolved (e.g., cache data is programmed in SLC). The command processing module 648 is responsible for implementing the collision logic while implementing a collision table 650 internally. The collision table 650 holds all LBAs that are cached and not stored in NAND.

In one embodiment, method 500 is implemented to facilitate the transfer of data from host computer system 602 to data storage device 610 by writing to SLC 622, TLC 624, and QLC 626, both Fine and Foggy. The method 500 along with one embodiment of the system shown in FIG. 6 may improve write performance by reducing the amount of NAND-bus and DRAM transfers by 0-10%, 10-20%, 20-30%, or in the range of 0-30%, in which 25% is average. The reduction of transfers may potentially reduce power consumption of the data storage device 610.

It is to be understood that while examples herein have referred to QLCs, the embodiments discussed herein are applicable to any MLC including two level cells (oftentimes referred to as MLCs), triple level cells (TLCs), quad level cells (QLCs) and cells with levels greater than four. Reference to MLC herein is understood to mean any level cell that is greater than 1 and thus encompassing dual level, triple level, quad level, and future generations that utilize foggy-fine programming.

In one embodiment, a data storage device comprises: one or more memory devices, the one or more memory devices including SLC memory and MLC memory; and a controller coupled to the one or more memory devices, the controller configured to: write data to the SLC memory; foggy write the data to MLC memory, wherein the foggy writing the data to the MLC memory occurs in parallel to the writing data to the SLC memory using the same buffer; read the data from the SLC memory; and fine writing the data read from SLC memory to the MLC memory. The data read from the SLC memory passes through a relocation buffer storage device. The data passes through the relocation buffer a single time prior to being written to the MLC memory. The controller is further configured to: receive a first release request to release the same buffer, wherein the first release request indicates that either the writing the data to the SLC memory or the foggy writing the data to the MLC memory has completed. The controller is further configured to receive a second release request to release the same buffer, wherein the second release request indicates that either the writing the data to the SLC memory or the foggy writing the data to the MLC memory has completed. The controller is further configured to release the same buffer upon receiving both the first release request and the second release request. The data passes through a relocation buffer after reading the data from SLC memory and prior to fine writing the data to MLC memory.

In another embodiment, a data storage device comprises: one or more memory devices; and a controller coupled to the one or more memory devices, the controller configured to: determine whether a first buffer release request for a buffer has been received; determine whether a second buffer release request for the buffer has been received; and release the buffer to an available buffer pool of buffers. The controller is further configured to hold the data in the buffer until the buffer has been released. The controller is further configured to not release the buffer if either the first buffer release request or the second buffer release request has not been received. The controller is further configured to increment a value of FirstFail from 0 to 1 if a first programming has failed. The controller is configured to increment a value of SecondFail from 0 to 1 if a second programming has failed. The controller is further configured to not release the buffer if either the FirstFail or the SecondFail is equal to 1. The controller is further configured to release the buffer to the available buffer pool of buffers only if both the first buffer release request and the second buffer release request have been received.

In another embodiment, a data storage device comprises: one or more memory devices; means to determine that a buffer has received two release requests; and means to foggy write to MLC memory in parallel with writing to SLC memory. The data storage device further comprises means to receive a first release request. The data storage device further comprises means to receive a second release request. The data storage device further comprises means to release the buffer, wherein the means to release the buffer is configured to release the buffer based upon feedback from the means to determine. The data storage device further comprises means to read data from SLC memory and fine write the data read from SLC memory to the MLC memory. The data storage device further comprises means to release a buffer to an available buffer pool.

By writing performing a foggy write directly to MLC without sending the data through the buffer an additional time, data writing can be improved as the data does not need to pass through the SLC multiple times to be written to MLC.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
one or more memory devices; and
a controller coupled to the one or more memory devices, the controller configured to:
determine whether a first buffer release request for a buffer has been received, wherein the first buffer release request corresponds to a first programming of data;
determine whether a second buffer release request for the buffer has been received, wherein the second buffer release request corresponds to a second programming of the same data, and wherein the second buffer release request is issued and received independently of the first buffer release request; and
release the buffer to an available buffer pool of buffers upon determining that the first buffer release request and the second buffer release request for the buffer have both been received.

2. The data storage device of claim 1, wherein the controller is further configured to hold data in the buffer until the buffer has been released.

3. The data storage device of claim 1, wherein the controller is further configured to not release the buffer if either the first buffer release request or the second buffer release request has not been received.

4. The data storage device of claim 1, wherein the controller is configured to increment a value of FirstFail from 0 to 1 if the first programming has failed.

5. The data storage device of claim 4, wherein the controller is configured to increment a value of SecondFail from 0 to 1 if the second programming has failed.

6. The data storage device of claim 5, wherein the controller is further configured to not release the buffer if either the FirstFail or the SecondFail is equal to 1.

7. The data storage device of claim 1, wherein the controller is further configured to release the buffer to the available buffer pool of buffers only if both the first buffer release request and the second buffer release request have been received.

8. A data storage device, comprising:
one or more memory devices;
means to determine that a buffer has received two release requests, wherein a first release request of the received two release requests corresponds with a single level cell (SLC) memory program of data, wherein a second release request of the received two release requests corresponds with a multi level cell (MLC) memory program of the same data, and wherein the first release request is issued and received independently of the second release request; and
means to foggy write to MLC memory in parallel with writing to SLC memory.

9. The data storage device of claim 8, further comprising means to receive the first release request.

10. The data storage device of claim 9, further comprising means to receive the second release request.

11. The data storage device of claim 10, further comprising means to release the buffer, wherein the means to release the buffer is configured to release the buffer based upon feedback from the means to determine.

12. The data storage device of claim 8, further comprising means to read data from SLC memory and fine write the data read from SLC memory to the MLC memory.

13. The data storage device of claim 8, further comprising means to release a buffer to an available buffer pool.

14. A data storage device, comprising:
one or more memory devices; and
a controller coupled to the one or more memory devices, the controller configured to:
receive a first release request for a buffer, wherein the first buffer release request corresponds to a first programming of data;
receive a second release request for the buffer, the second buffer release request corresponds to a second programming of the same data, wherein the second buffer release request is issued and received independently of the first buffer release request; and
upon receiving both the first release request and the second release request for the buffer, release the buffer to an available buffer pool.

15. The data storage device of claim 14, wherein the buffer stores data being first programmed to SLC memory and second programmed to MLC memory, and wherein the data being first programmed occurs in parallel to the same data being second programmed.

16. The data storage device of claim 14, wherein the first release request indicates that either writing data to SLC memory or foggy writing data to MLC memory has completed.

17. The data storage device of claim 16, wherein the second release request indicates that either the writing the data to the SLC memory or the foggy writing the data to the MLC memory has completed, and wherein the second release request is different than the first release request.

18. The data storage device of claim 14, wherein releasing the buffer comprises completing both writing data to SLC memory and foggy writing data to MLC memory.

19. The data storage device of claim 18, wherein fine writing the data to the MLC memory occurs after the foggy writing data to the MLC memory has completed.

20. The data storage device of claim 19, wherein the fine writing comprises:
reading the data from the SLC memory;
passing the data through a relocation buffer a single time before the fine writing the data to the MLC memory; and
fine writing the data to the MLC memory.

* * * * *